(12) United States Patent
Liu (10) Patent No.: US 7,684,235 B2
(45) Date of Patent: Mar. 23, 2010

(54) PHASE CHANGE MEMORY

(75) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/408,420

(22) Filed: Mar. 20, 2009

(65) Prior Publication Data
US 2009/0219751 A1 Sep. 3, 2009

Related U.S. Application Data

(62) Division of application No. 11/512,685, filed on Aug. 30, 2006, now Pat. No. 7,511,984.

(51) Int. Cl.
*G11C 11/00* (2006.01)
(52) U.S. Cl. .................... 365/163; 365/148
(58) Field of Classification Search ............ 365/163, 365/148
See application file for complete search history.

(56) References Cited

U.S. PATENT DOCUMENTS

| | | | |
|---|---|---|---|
| 5,296,716 A | 3/1994 | Ovshinsky et al. | |
| 5,687,112 A | 11/1997 | Ovshinsky | |
| 6,737,312 B2 | 5/2004 | Moore | |
| 6,894,305 B2 | 5/2005 | Yi et al. | |
| 6,982,913 B2 | 1/2006 | Oh et al. | |
| 7,042,001 B2 | 5/2006 | Kim et al. | |
| 7,071,021 B2 | 7/2006 | Harshfield et al. | |
| 7,545,668 B2 * | 6/2009 | Philipp et al. | 365/148 |
| 2002/0132415 A1 | 9/2002 | Besser et al. | |
| 2003/0036232 A1 | 2/2003 | Dennison | |
| 2004/0115372 A1 | 6/2004 | Lowrey | |
| 2006/0071204 A1 * | 4/2006 | Happ | 257/3 |
| 2006/0145199 A1 | 7/2006 | Lee | |
| 2006/0151771 A1 | 7/2006 | Asano et al. | |
| 2006/0175599 A1 | 8/2006 | Happ | |
| 2007/0121363 A1 | 5/2007 | Lung | |
| 2007/0153571 A1 * | 7/2007 | Elkins | 365/163 |
| 2008/0061341 A1 | 3/2008 | Lung | |
| 2008/0191187 A1 * | 8/2008 | Lung et al. | 257/4 |
| 2008/0197334 A1 * | 8/2008 | Lung | 257/2 |
| 2009/0050869 A1 * | 2/2009 | Kim et al. | 257/2 |
| 2009/0194758 A1 * | 8/2009 | Chen | 257/4 |

(Continued)

FOREIGN PATENT DOCUMENTS

EP 1 318 552 A1 6/2003

(Continued)

OTHER PUBLICATIONS

S. Hudgens and B. Johnson, "Overview of Phase-Change Chalcogenide Nonvolatile Memory Technology," *MRS Bulletin*, Nov. 2004, pp. 829-832.

(Continued)

*Primary Examiner*—Tuan T. Nguyen
(74) *Attorney, Agent, or Firm*—Leffert Jay & Polglaze, P.A.

(57) ABSTRACT

A PCRAM cell has a high resistivity bottom electrode cap to provide partial heating near the interface between the cell and the bottom electrode, preventing separation of the amorphous GST region from the bottom electrode, and reducing the programming current requirements.

25 Claims, 9 Drawing Sheets

U.S. PATENT DOCUMENTS

2009/0236582 A1* 9/2009 Lee et al. .................. 257/3
2009/0251950 A1* 10/2009 Klostermann ............... 365/158
2009/0261313 A1* 10/2009 Lung et al. .................. 257/4

FOREIGN PATENT DOCUMENTS

| EP | 1 331 675 A1 | 7/2003 |
|---|---|---|
| WO | WO 97/15954 | 5/1997 |
| WO | WO 02/09206 | 1/2002 |

OTHER PUBLICATIONS

S.H. Lee, et al., "Full Integration and Cell Characteristics for 64Mb Nonvolatile PRAM," *Symposium on VLSI Technology Digest of Technical Papers*, 2004, pp. 20-21.

Stefan Lai, "Current status of the phase change memory and its future," *IEDM '03 Technical Digest*, Dec. 2003, pp. 10.1.1-10.1.4.

A.L. Lacaita, "Phase change memories: State-of-the-art, challenges, and perspectives," *Solid-State Electronics*, 2006, pp. 24-31.

Matthias Wuttig, "Phase-Change Materials; Towards a universal memory?" *Nature Materials*, Apr. 2005, pp. 265-266.

* cited by examiner

PHASE CHANGE MEMORY

RELATED APPLICATION

This application is a divisional of U.S. application Ser. No. 11/512,685, titled "PHASE CHANGE MEMORY," filed Aug. 30, 2006 (allowed) now U.S. Pat. No. 7,511,984, which is commonly assigned and incorporated herein by reference.

FIELD

The present disclosure relates generally to phase change memories and in particular the present disclosure relates to phase change memory electrodes.

BACKGROUND

Phase change random access memory (PCRAM) is a non-volatile form of memory that uses the reversible process of changing the state of an alloy containing one or more elements from Group V or VI of the periodic table between amorphous and crystalline states upon application of an electric current, and wherein the two states have substantially different electrical resistance. Typical current phase change memories use a chalcogenide alloy, such as a Germanium-Antimony-Tellurium (GeSbTe, or GST, most commonly $Ge_2Sb_2Te_5$) alloy. The amorphous (a-GST) and crystalline (c-GST) states of the material have largely different resistivity, on the order of three orders of magnitude, so that a determination of the state is easily done. The crystalline state has typical resistance on the order of kiloOhms (kΩ), whereas the amorphous state has typical resistance on the order of megaOhms (MΩ). The states are stable under normal conditions, so the PCRAM cell is a non-volatile cell with a long data retention. When the GST is in its amorphous state, it is said to be RESET. When the GST is in its crystalline state, it is said to be SET. A PCRAM cell is read by measuring its resistance.

Figure 1:
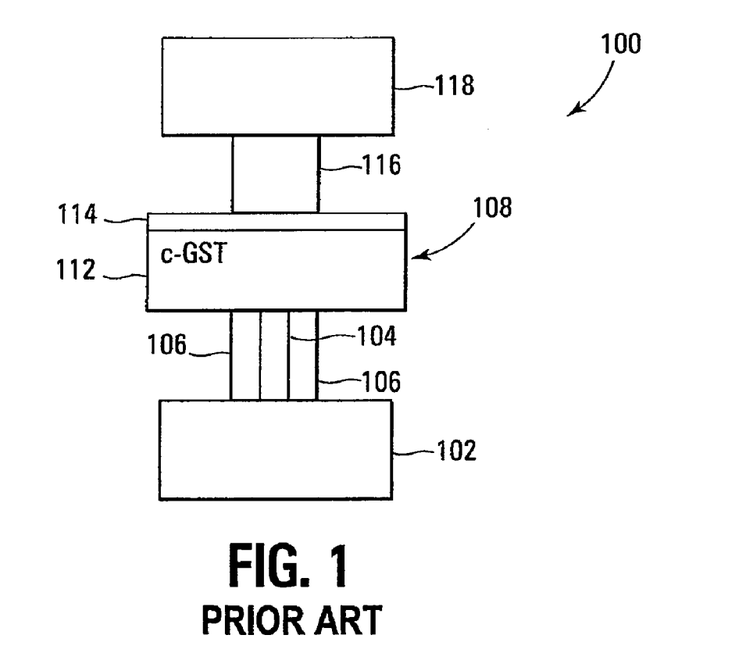
FIG. 1 is a cross-sectional view of a typical phase change memory cell in a SET state.

The structure of a typical vertical PCRAM cell in a SET state 100 as shown in FIG. 1 includes a bottom metal contact 102, a bottom electrode 104 surrounded by dielectric material 106, a chalcogenide (GST) 108 having a crystalline portion (c-GST) 112, a top electrode 114, a metal top contact 116, and a cell select line 118. The GST 108 being all c-GST means that the GST has a high conductivity, and low resistance, typically on the order of kΩ. The bottom electrode 104 is sometimes referred to as a heater.

Figure 2:
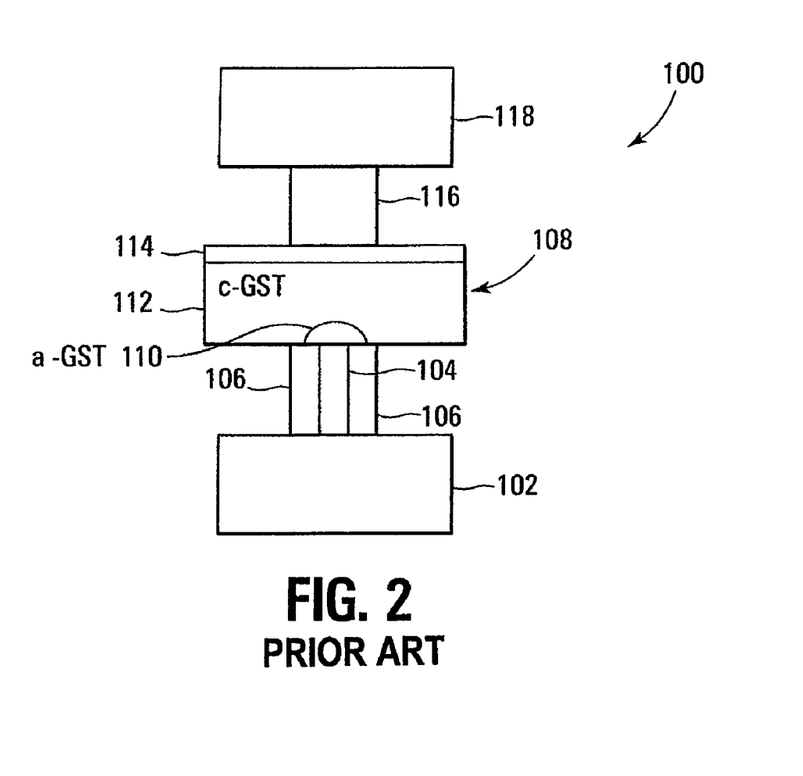
FIG. 2 is a cross-sectional view of a typical phase change memory cell in a RESET state.

A RESET structure of the PCRAM cell 100 is shown in FIG. 2. The bottom electrode 104 is typically a high conductivity, low resistivity metal or alloy (less than 1 milliOhms.cm (mΩ.cm)). To change the cell 100 from a SET state to a RESET state, a current is passed through the bottom metal contact 102 and bottom electrode 104. This current heats a programmable volume region of the GST 108 near the top of the bottom electrode 104 to a temperature sufficient to melt the GST in that region. Typical melting points for many GST materials are in the range of 600 degrees C., although the melting point differs for other chalcogenides. When the current is removed, a section of the programmable volume of GST 108 that has been heated to its melting point rapidly cools due to heat dissipation into the surrounding materials. This rapid cooling does not allow the melted programmable volume region to cool in a crystalline state. Instead, a region of amorphous GST (a-GST 110) remains at or near the top of the heater 104.

Figure 3:
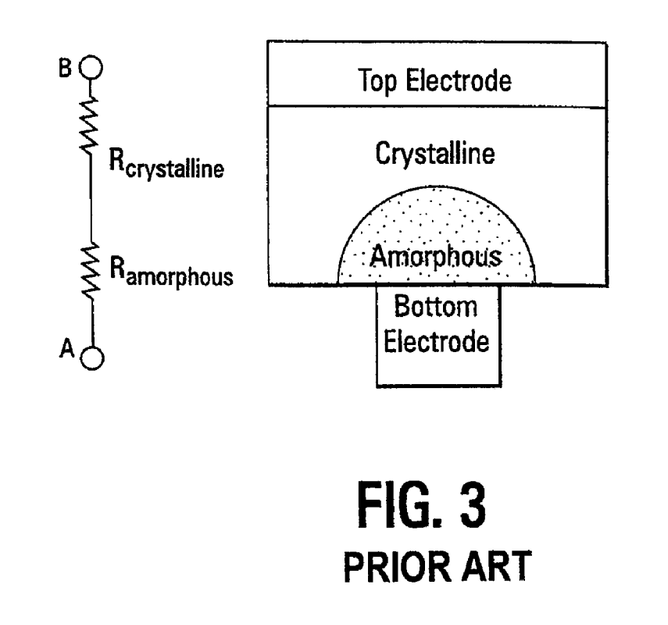
FIG. 3 is a partial cross-sectional view of a desired RESET structure in a phase change memory cell.

The desired a-GST region is a hemispherical region covering the top of the bottom electrode 104 and extending slightly into the field of c-GST. This allows for a high resistance of the GST 108, as the resistances of the c-GST 112 and a-GST 110 portions behave electrically as series a connected resistance. This is shown in FIG. 3.

The majority of the heat generated by the current passing through the bottom electrode 104 does not contribute to heating of the GST 108, since the heat is dissipated by the surrounding dielectric material 106. Therefore, most of the heating of the programmable volume region of GST 108 is due to resistive heating near the top of the heater 106.

In typical PCRAM cells, the cell (the GST layer) and the top electrode are patterned together with the current flowing from the top electrode contact to the bottom electrode. In this arrangement, current density is mostly symmetric. In an ideal RESET state, a hemispheric region of GST covering the entire area of the bottom electrode contact is converted to the amorphous state (a-GST 110), to prevent a parallel leakage path.

Figure 4:
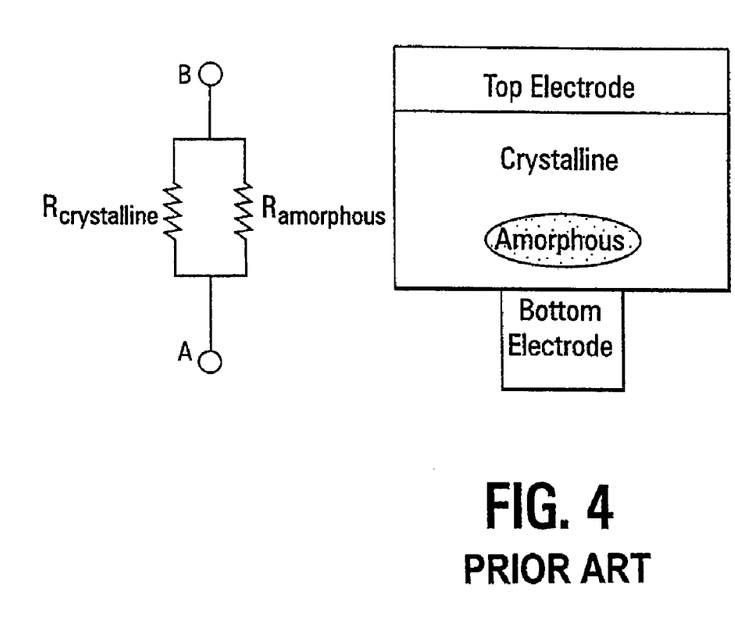
FIG. 4 is a partial cross-sectional view of a failure state RESET structure in a phase change memory cell.

The hottest region in the GST programmable volume is typically about 20 nanometers above the interface between the bottom electrode 104 and the GST 108 due to heat loss through bottom electrode 104. The inefficient heating of low resistance bottom electrodes 104 combined with the hottest region being above the interface between the bottom electrode 104 and the GST 108 can create an amorphous GST region that is separated from the bottom electrode as shown in FIG. 4. This leads to a parallel resistance connection for the a-GST and c-GST regions, and the current flows though the low resistance path of the parallel circuit, the result being that the cell is stuck at a low resistance state and the GST cannot be converted back to a high resistance state.

Still further, a RESET current pulse that is too large will form an ideal hemispherical amorphous region covering the bottom electrode 104, but will create a region of the GST that is too hot, often in excess of 900 degrees C. This hot spot can cause bubbling, sublimation, or composition change.

To switch the cell 100 from a RESET state to a SET state, a SET current is passed through the metal contact 102 and bottom electrode 104 to heat the a-GST section 110 near the top of the bottom electrode 104 to a temperature below the melting point, but sufficiently high (on the order of 350 degrees C. for typical GST materials, but different for other chalcogenides) at which the mobility of atoms in the region near the top of the bottom electrode 104 allows them to rearrange from an amorphous state to a crystalline state. The resulting configuration has a GST 108 that is all crystalline, as is shown in FIG. 1.

The currents used to SET and RESET the cell are typically as follows. A SET state is achieved by applying a voltage or current pulse sufficient to raise the GST temperature in the programmable volume to below the melting point but above its crystallization temperature, and is held for a sufficient time to allow the rearranging of the atoms to a crystalline state. A RESET state is achieved by applying a voltage or current pulse sufficient to raise the GST temperature in the programmable volume to the melting point, and is held typically for a shorter time than the SET pulse. The SET pulse is typically longer in duration but of lower amplitude than the RESET pulse. The RESET pulse is typically shorter in duration but of higher amplitude than the SET pulse. The actual amplitudes and durations of the pulses depend upon the size of the cells and the particular phase change materials used in the cell. RESET currents for many GST cells are currently in the 400 to 600 microAmpere (μA) range, and have durations in the 10-50 nanosecond range, whereas SET currents are currently in the 100 to 200 μA range and have durations in the 50-100 nanosecond range. Read currents are lower than either SET or RESET currents. As cell size continues to decrease, the currents involved and the durations thereof also continue to decrease.

For the reasons stated above, and for other reasons stated below which will become apparent to those skilled in the art upon reading and understanding the present specification, there is a need in the art for improved PCRAM structures and methods for phase change memory switching.

DETAILED DESCRIPTION

In the following detailed description of the embodiments, reference is made to the accompanying drawings that form a part hereof. In the drawings, like numerals describe substantially similar components throughout the several views. These embodiments are described in sufficient detail to enable those skilled in the art to practice the embodiments. Other embodiments may be utilized and structural, logical, and electrical changes may be made without departing from the scope of the application.

The following detailed description is, therefore, not to be taken in a limiting sense, and the scope of the present disclosure is defined only by the appended claims, along with the full scope of equivalents to which such claims are entitled.

Embodiments disclosed herein use a high resistivity cap on a bottom electrode of a PCRAM cell to increase the contribution of the bottom electrode to heating of a programmable region of a phase change material of the cell. While GST is used in the description herein, it should be understood that other phase change materials including other chalcogenides, are amenable to use with the various embodiments. For example only, phase change materials include but are not limited to GeTe, In—Se, $Sb_2Te_3$, GaSb, InSb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, Ge—Te—Sn—Pt, and the like. For purposes of this application, resistivity refers to electrical resistivity.

Figure 5:
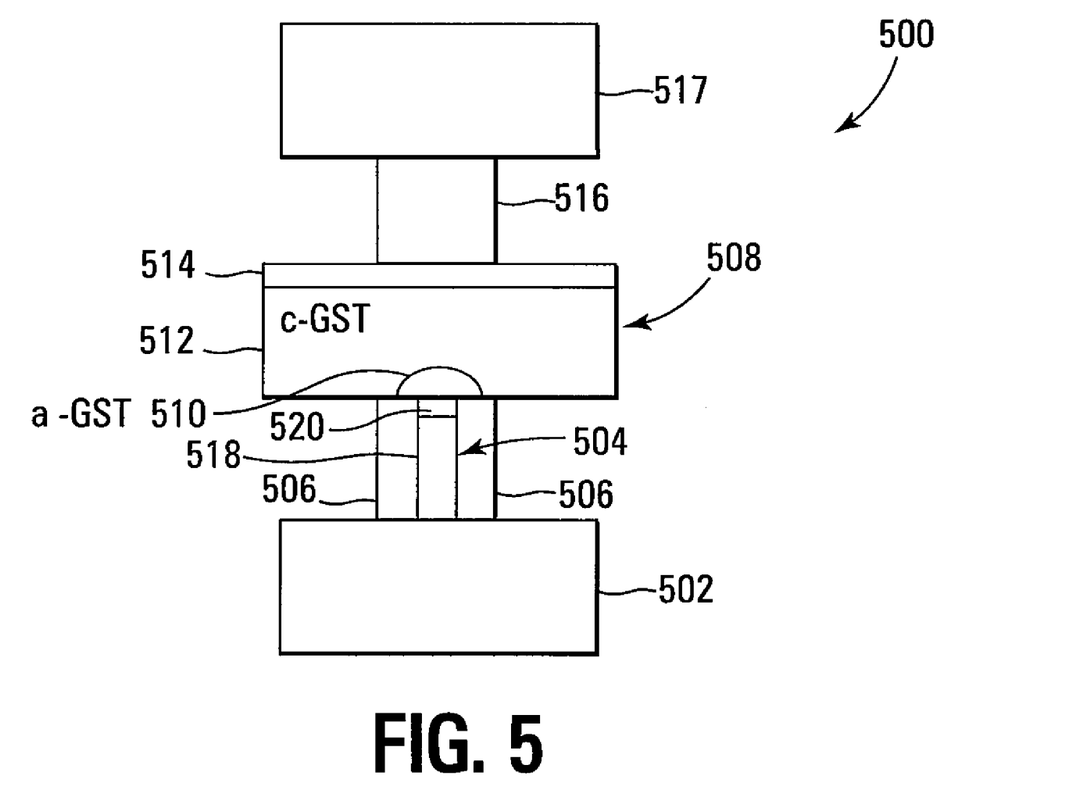
FIG. 5 is a cross-sectional view of a phase change memory cell according to one embodiment.

FIG. 5 shows a PCRAM cell 500 in cross section. Cell 500 includes a mostly typical set of components similar to those shown in FIGS. 1 and 2, and operates under the same general principles. A lower metal contact 502 has thereon a bottom electrode 504 surrounded by dielectric material 506. A phase change material 508, such as a chalcogenide or GST material, is above the bottom electrode 504, and is topped with a top electrode 514, a top metal contact 516, and a cell select line 517. The phase change material 508 is shown in FIG. 5 having an amorphous region 510 and a crystalline region 512. The bottom electrode 504 has two parts, a main, lower portion, element 518 and a top, upper portion, electrode cap 520.

In one embodiment, for a total bottom electrode height of approximately 100 nm, the top electrode cap 520 thickness is in a range of 2 nm to 20 nm (currently approximately 2 to 20% of the total height of the bottom electrode), and it is formed of a high resistivity material (from 1 $m\Omega.cm$ to 1000 $m\Omega.cm$). The main element 518 is formed of a low resistivity material. The high resistivity material close to the GST programmable volume creates a partial heating of the GST programmable volume by the resistive heating in the electrode cap 520. This heating serves to move the hottest region of the GST closer to the interface between the bottom electrode 504 and the GST 508, and to prevent the formation of an amorphous region of GST separated from the top of the bottom electrode 504.

One problem with simply making the entire heater a high resistivity material is that partial heating of the cell GST will occur, but a majority of the heat generated by the current passing through the high resistivity heater will be dissipated into the surrounding dielectric without contributing to the heating of the GST material. Further, power consumption will increase due to the high amounts of voltage required to get current to the GST region through the high resistivity heater element.

The embodiments herein concentrate heating due to the bottom electrode 504 at its top where the high resistivity cap 520 is, that is, near the interface between the bottom electrode 504 and the GST 508. The heat produced by the high resistivity cap 520 is close to the cell (GST 508) interface, and provides efficient heating of the programmable volume, and prevents the formation of a crystalline GST region between the bottom electrode 504 and the amorphous GST region formed at the top of the bottom electrode 504. Further, since high electrical resistivity material has a lower thermal conductivity than low electrical resistivity material, the traditional heat sink effect of a low electrical resistivity heater element is reduced at or near the interface between the heater element and the GST. In combination, the programming current requirements can also be reduced.

As an example, a typical PCRAM cell such as that shown in FIGS. 1 and 2 with a bottom electrode diameter of 50 nanometers (nm) and a height of 100 nm, having an undoped GST thickness of 100 nm, has a SET resistance of approximately 2 $k\Omega$ (with a typical GST resistivity of 4 $m\Omega.cm$). With a bottom electrode material of TiAlN (resistivity 4 $m\Omega.cm$), the series resistance from the bottom electrode is approximately 2 $k\Omega$, which consumes almost the same energy as a RESET operation. The majority of the energy is lost without contribution to switching of the GST state. Therefore, commonly used bottom electrodes are lower resistivity materials. For example, TiN, having a resistivity of 0.17 $m\Omega.m$ equates to a series resistance of 87$\Omega$.

In the embodiment shown in FIG. 5, on the other hand, assuming the same component sizes as in the previous example, that is, a bottom electrode diameter of 50 nm and a height of 100 nm, 20 nm of which is TiAlN instead of TiN, and having an undoped GST thickness of 100 nm, still has a SET resistance of 2 kΩ (with GST resistivity of 4 mΩ.cm). However, with the cap electrode of TiAlN, which may have a resistivity on the order of 20 mΩcm, the resistance of the cap 520 is approximately 2 kΩ, which consumes the same energy as the GST cell RESET operation, but provides the majority of the energy to heat up the GST near the interface between the bottom electrode and the GST. This in turn promotes the formation of a proper hemispheric a-GST region covering and in contact with the bottom electrode.

Figure 6A:
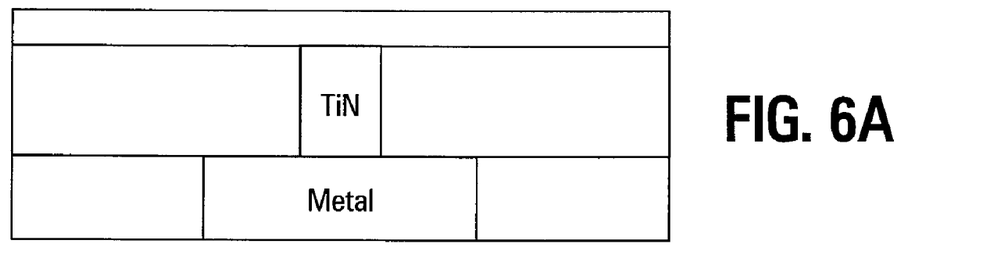
FIGS. 6A to 6E are in-process cross-sectional views of formation of an electrode cap according to another embodiment.
Figure 6B:
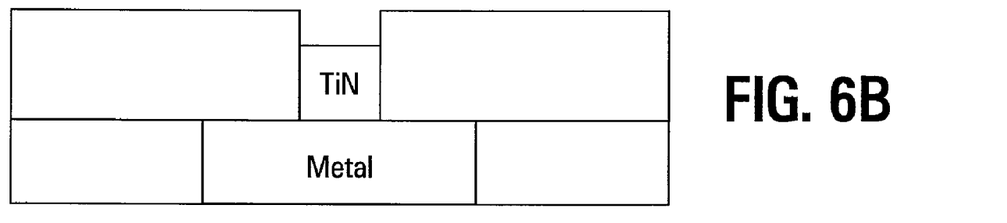
Figure 6C:
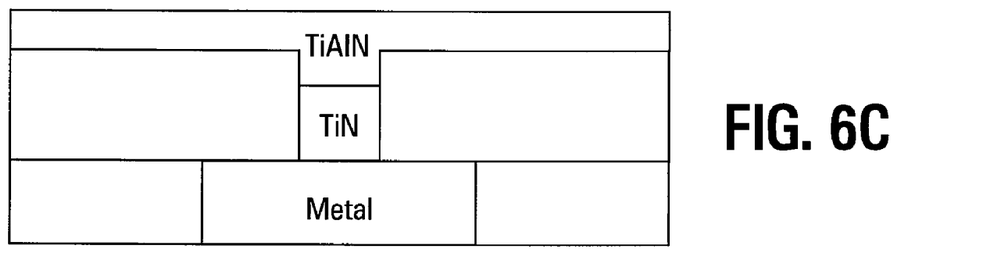
Figure 6D:
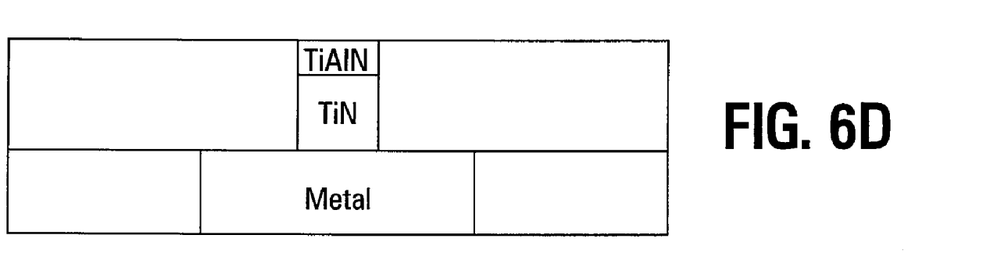
Figure 6E:
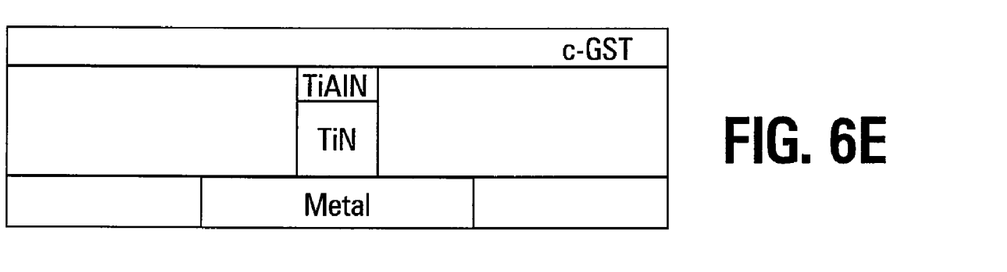

The electrode cap 520 described above can be formed in a number of ways. For example, FIGS. 6A-6E show the formation of an electrode cap such as cap 520 in a series of in-process cross-sectional views. During formation of the bottom electrode, usually TiN or Tungsten (W), an overlayer of electrode material is deposited as is shown in FIG. 6A. FIG. 6B shows the results of an appropriate chemical mechanical planarization (CMP) process and overpolish, resulting in a 20 nm or less recess at the top of the bottom electrode. A thin layer of high resistivity material is deposited either with plasma vapor deposition or chemical vapor deposition, the results of which are shown in FIG. 6C. Following another CMP buffering, a 20 nm or less high resistivity cap remains on the bottom electrode as shown in FIG. 6D. The crystalline GST layer is then deposited as is shown in FIG. 6E. Alternatively, the recess can be formed by a wet etch process, a plasma dry etch process, or the like.

Figure 7A:
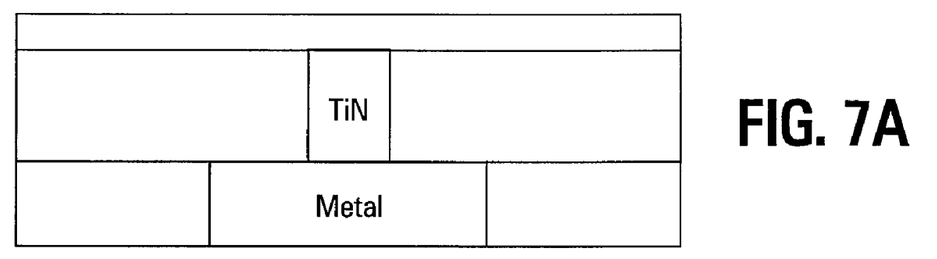
FIGS. 7A to 7D are in-process cross-sectional views of formation of an electrode cap according to another embodiment.
Figure 7B:
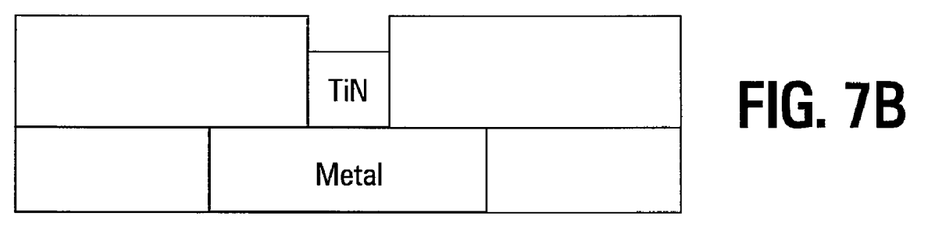
Figure 7C:
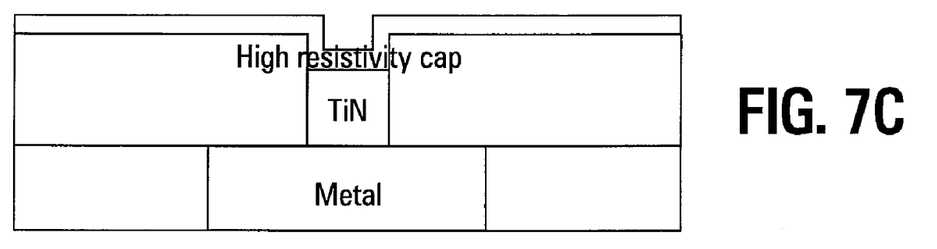
Figure 7D:
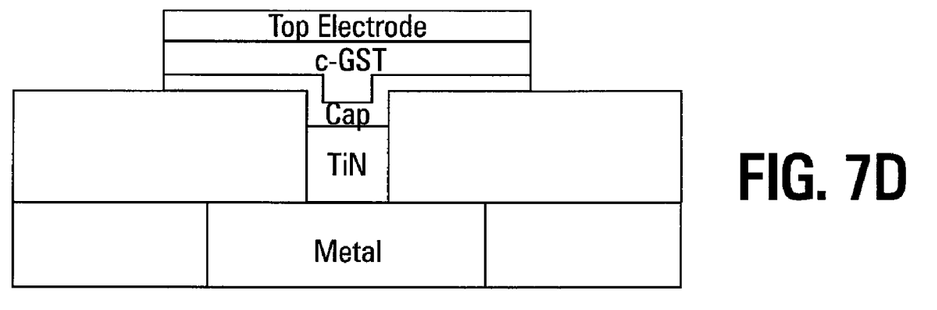

Alternatively, an electrode cap such as cap 520 can be formed as shown in FIGS. 7A-7D, a series of in-process cross-sectional views. During formation of the bottom electrode, usually TiN or Tungsten (W), an overlayer of electrode material is deposited as is shown in FIG. 7A. FIG. 7B shows the results of an appropriate chemical mechanical planarization (CMP) process and overpolish, resulting in a 20 nm or less recess at the top of the bottom electrode. A thin layer of high resistivity material is deposited either with plasma vapor deposition or chemical vapor deposition in the recess and over the dielectric as shown in FIG. 7C, and is patterned together with the GST layer as shown in FIG. 7D. The resistivity of the tin layer (from 2 nm to 20 nm) is high enough so that it does not change the electric current distribution in the bottom electrode much, but still forms a local heater above the low resistivity bottom electrode to promote localized GST heating at the interface between the cap and the GST.

Figure 8A:
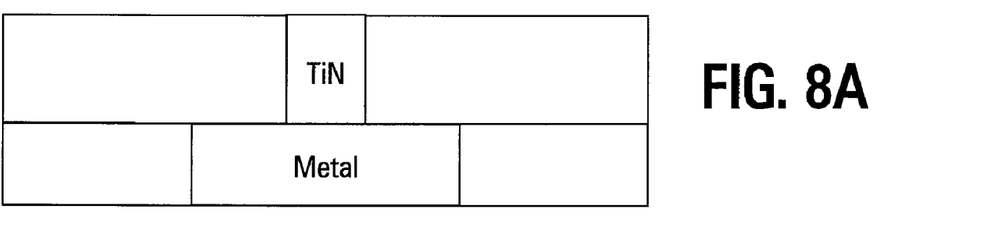
FIGS. 8A to 8C are in-process cross-sectional views of formation of an electrode cap according to another embodiment.
Figure 8B:
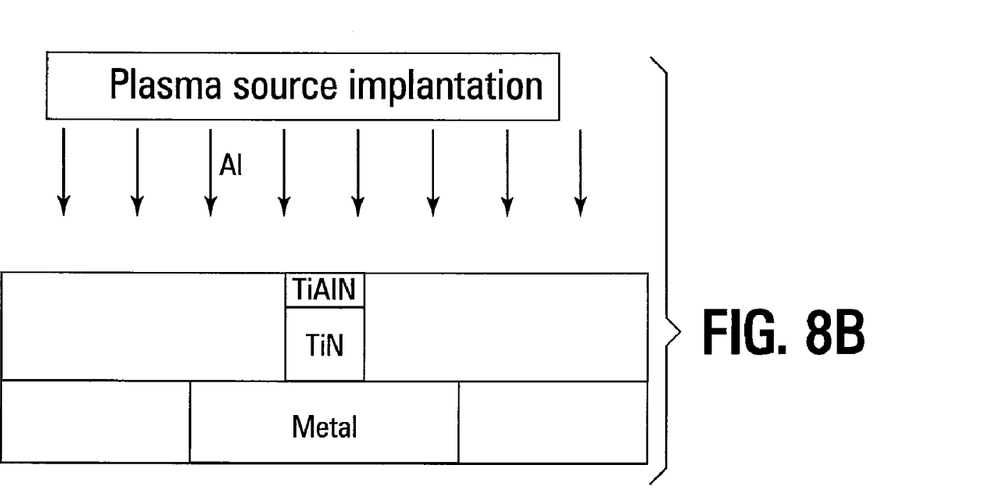
Figure 8C:
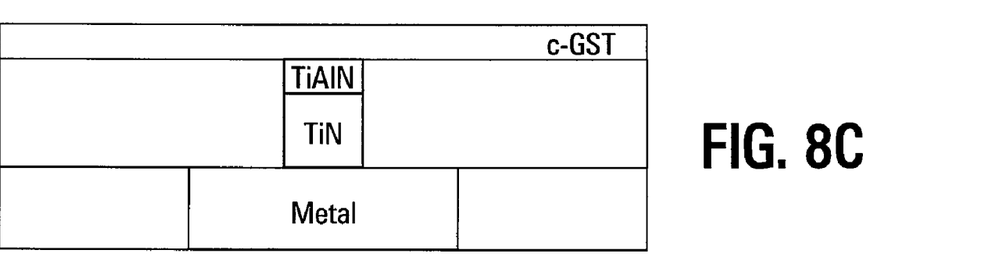

Another method for forming the bottom electrode with a high resistivity cap is shown in FIGS. 8A-8C, and uses low energy plasma source implantation to dope the top of a bottom electrode plug with an appropriate dopant to form a thin layer of high resistivity material as is shown in FIGS. 8A and 8B. In one embodiment, the bottom electrode plug is TiN and the dopant is Al, or the bottom electrode plug is TiAl and the dopant is N, or the plug is TaN and the dopant is N to form a top cap layer of Nitrogen-rich high resistivity TaN. It should be understood that various dopants and bottom electrode plug materials could be used to create a top cap on the bottom electrode, the top cap having a much higher resistivity than the plug.

It should be noted that the resistivity of materials such as TiAlN and TaN can be increased by several orders of magnitude by increasing Nitrogen concentrations in the compounds. This increase in Nitrogen concentration can be accomplished, for example, by adjusting Nitrogen-containing gas ratio during chemical vapor deposition or physical vapor deposition of the bottom electrode material or low energy Nitrogen plasma source implantation.

The low resistivity material typically used for bottom electrodes or plugs is as low a resistance conductor as can be formed, for example W, TiN, TiW, Pt, TiAlN (with low Nitrogen concentrations) and the like. The various electrode caps and high resistivity layers of the various embodiments can be formed of any number of high resistivity materials, including by way of example only, TiAlN, AlPdRe, HfTe$_5$, TiNiSn, PbTe, Bi$_2$Te$_3$, TiN, ZrN, HfN, VN, NbN, TaN, TiC, ZrC, HfC, VC, NbC, TaC, TiB$_2$, ZrB$_2$, HfB$_2$, VB$_2$, NbB$_2$, TaB$_2$, Cr$_3$C$_2$, Mo$_2$C, WC, CrB$_2$, Mo$_2$B$_5$, W$_2$B$_5$, TiAlN, TaSiN, TiCN, SiC, B4C, WSi$_{(x)}$, MoSi$_2$, or the like.

Figure 9:
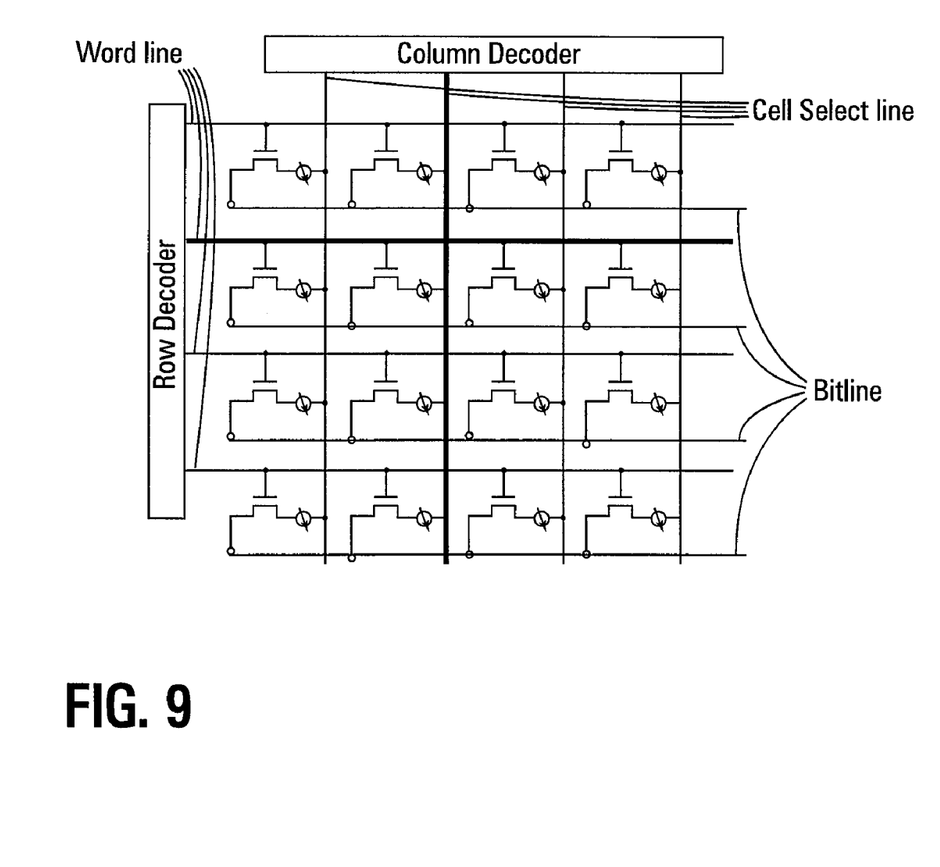
FIG. 9 is a simplified circuit diagram of a portion of a memory array according to another embodiment.

PCRAM memory arrays can take several different forms, each of which are amenable to use with the bottom electrode cap configuration PCRAM cells described above. Examples of PCRAM memory arrays include an array of PCRAM cells each comprising an access transistor (metal oxide semiconductor field effect transistor (MOSFET) or bipolar transistor) and one PCRAM cell, in other words a 1T1C configuration. The resistance of the PCRAM cell can be switched between high and low states by resetting the GST of the cell to an amorphous state (high resistance) or setting the cell to a crystalline state (low resistance). Both set and reset currents are provided through the access transistor. An example of a portion of a PCRAM array of this type is shown in FIG. 9. A cell is selected by selecting its corresponding word line and cell select line. Bitlines may be tied to a common voltage source or individually selected. To RESET a cell, a large short pulse is applied to the corresponding cell select line while its word line is turned on. The RESET current flows through the selected memory element and resets the cell. To SET a cell, a smaller but longer pulse is applied to the cell select line to heat the memory element above its crystallization temperature but below its melting point. To read a cell, a voltage smaller than the threshold switching voltage of amorphous phase change material is applied to the cell select line.

Figure 10:
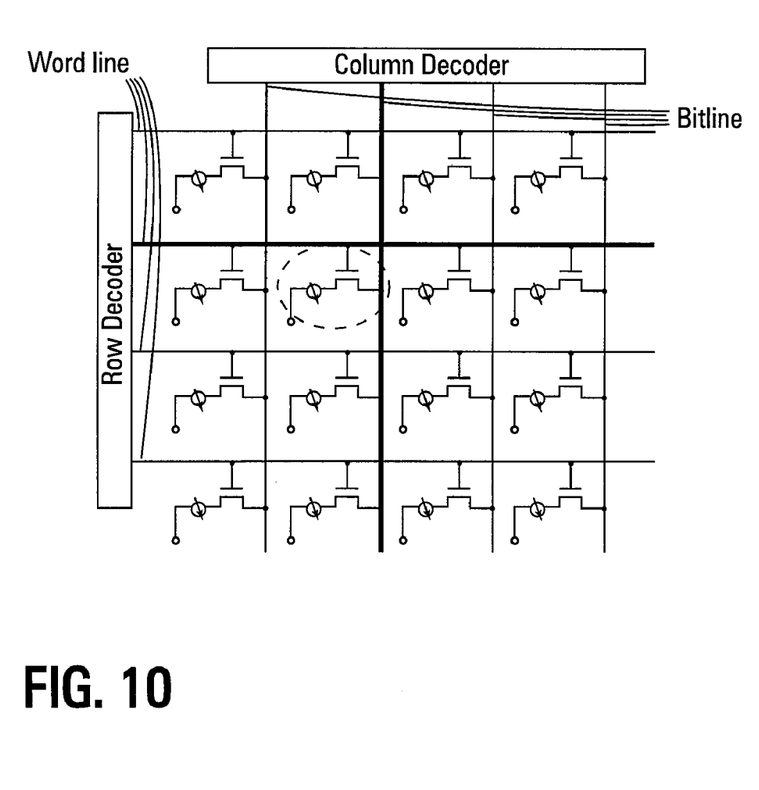
FIG. 10 is a simplified circuit diagram of a portion of a memory array according to another embodiment.

Another PCRAM memory array uses a large block of phase change material and a top electrode, and is shown in general in FIG. 10. A common voltage is applied to the top electrode to bias all memory bits. A memory element is selected by selecting its word line and bitline.

Figure 11:
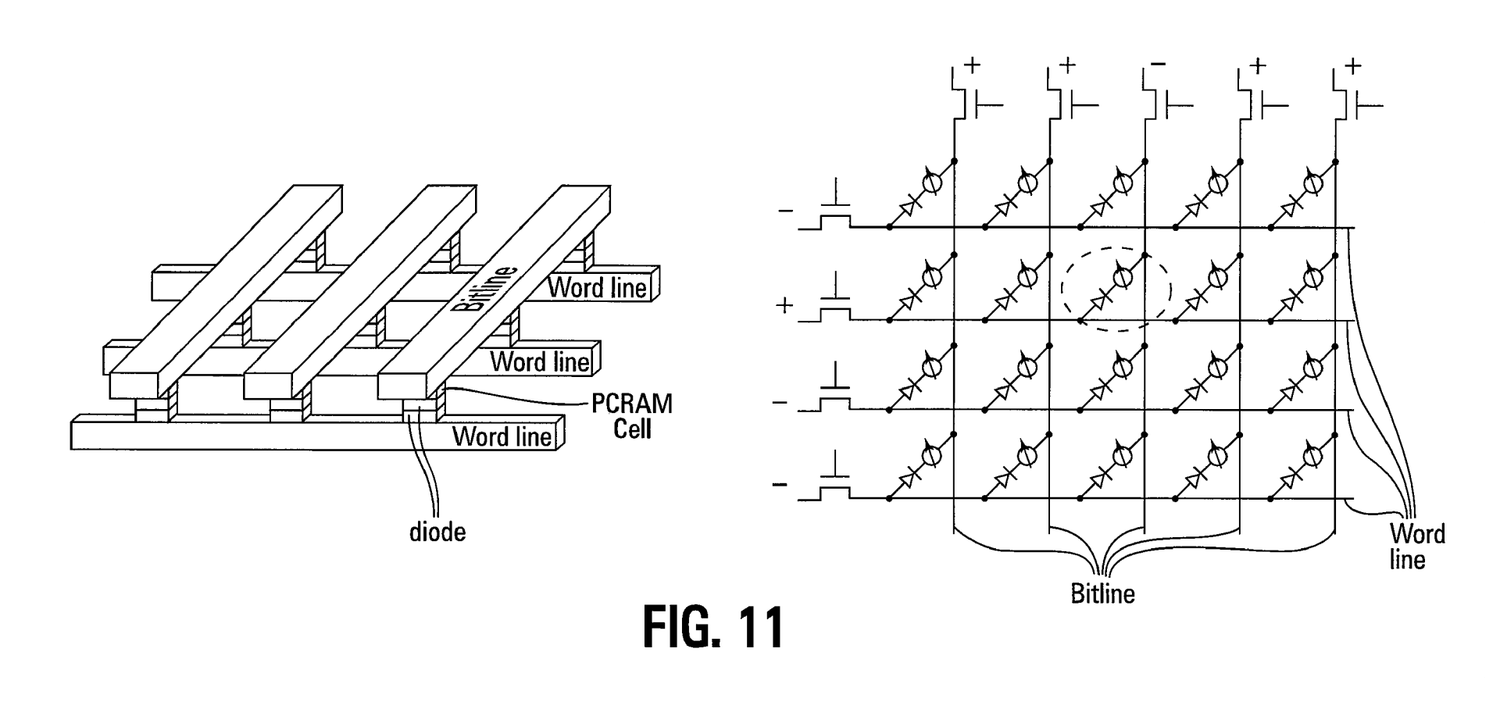
FIG. 11 is a simplified circuit diagram of a portion of a memory array according to another embodiment.

Yet another PCRAM memory array is shown in FIG. 11. Diode-accessed cross-point PCRAM arrays select a memory element by biasing its word line high and non-selected word lines low, while biasing its selected bitline low and non-selected bitlines high. Only the diode connected to the selected cell is forward biased. All other diodes are reverse biased or do not have sufficient bias to overcome their threshold voltage, and no current flows except in the selected cell.

PCRAM arrays can be used in various memory devices, and may be coupled to a processor or memory controller, and may form part of an electronic system, including but not limited to memory modules for computers, cameras, portable storage devices, digital recording and playback devices, PDAs, and the like.

CONCLUSION

PCRAM cells and methods of forming them have been described that include a high resistivity cap on the bottom electrode to provide localized heating of a GST layer of the cell, preventing separation of an amorphous GST region from the top of the bottom electrode, and reducing its programming current requirements.

Although specific embodiments have been illustrated and described herein, it will be appreciated by those of ordinary skill in the art that any arrangement, which is calculated to achieve the same purpose, may be substituted for the specific embodiments shown. This application is intended to cover any adaptations or variations of the embodiments. Therefore, it is manifestly intended that this application be limited only by the claims and the equivalents thereof.

What is claimed is:

1. A method of operating a phase change memory cell, comprising:
    changing a phase of a phase change material of the memory cell in part using heating from a bottom electrode of the memory cell, wherein heating from the bottom electrode comprises:
        heating with resistive heating in a top portion of the bottom electrode at an interface between the bottom electrode and the phase change material.

2. The method of claim 1, wherein heating further comprises:
    providing a bottom electrode cap of a material having a substantially higher resistivity than a resistivity of a lower portion of the bottom electrode so as to heat the cap hotter than the lower portion.

3. The method of claim 2, wherein a thickness of the bottom electrode cap is approximately 2-20% of a total height of the bottom electrode.

4. The method of claim 2, wherein the lower portion of the bottom electrode has a resistivity less than 1 milliOhm.cm.

5. The memory cell of claim 2, wherein the material of the bottom electrode cap has a resistivity of greater than 1 milliOhm.cm.

6. The memory cell of claim 2, wherein the material of the bottom electrode cap has a resistivity of 1 milliΩ.cm to 1000 milliΩ.cm.

7. The method of claim 2, wherein a material of the lower portion of the bottom electrode has a higher thermal conductivity than the material of the bottom electrode cap.

8. The method of claim 1, wherein changing a phase comprises:
    switching between an amorphous state and a crystalline state of the phase change material of the phase change memory cell.

9. The method of claim 1, wherein switching between an amorphous state and a crystalline state of the phase change material of the phase change memory cell respectively switches the phase change memory cell between a RESET and a SET state of the phase change memory cell.

10. The method of claim 1, wherein changing a phase comprises:
    switching between a higher resistance state and a lower resistance state of the phase change material of the phase change memory cell.

11. The method of claim 10, wherein a resistance in the higher resistance state is about three orders of magnitude higher than a resistance in the lower resistance state.

12. A method of operating a phase change memory cell, comprising:
    switching between an amorphous state and a crystalline state of a phase change material of the cell by applying a current to a bottom electrode, and concentrating resistive heating in an upper portion of the bottom electrode.

13. The method of claim 12, wherein concentrating resistive heating comprises:
    passing current through a bottom electrode having a lower portion of a first material having a first resistivity and an upper portion of a second material having a second resistivity, the second resistivity substantially higher than the first resistivity.

14. The method of claim 13, further comprising:
    passing a first current through the bottom electrode sufficient to raise a temperature of the crystalline state of the phase change material above its melting point; and
    removing the first current so as to let the phase change material cool to the amorphous state of the phase change material.

15. The method of claim 14, further comprising:
    passing a second current through the bottom electrode sufficient to raise a temperature of the amorphous state of the phase change material to a level below its melting point; and
    removing the second current so as to let the phase change material cool to the crystalline state of the phase change material.

16. The method of claim 14, wherein the first current has a larger magnitude than the second current and is passed through the bottom electrode for a shorter time duration than the second current.

17. The method of claim 12, wherein a thickness of the upper portion of the bottom electrode is approximately 2-20% of a total height of the bottom electrode.

18. The method of claim 12, wherein the phase change memory cell has a higher resistance in the amorphous state than in the crystalline state.

19. The method of claim 12, wherein the upper portion of the bottom electrode is in contact with the phase change material of the cell.

20. A method of switching a phase of a phase change memory cell, comprising:
    heating a programmable volume of a phase change cell material with a bottom electrode having a lower portion of a first material and a cap of a second material, the second material having a resistivity substantially higher than a resistivity of the first material.

21. The method of claim 20, wherein the programmable volume of the phase change cell material is initially in a crystalline state, and further comprising:
    heating the programmable volume of the phase change cell material in the crystalline state past its melting point to form a melted programmable volume of the phase change cell material; and
    cooling the melted programmable volume of the phase change cell material to form a programmable volume of the phase change cell material in an amorphous state.

22. The method of claim 20, wherein the programmable volume of the phase change cell material is initially in an amorphous state, and further comprising:
    heating the programmable volume of the phase change cell material in the amorphous state to a temperature below its melting point to cause the amorphous state to change to a crystalline state.

23. The method of claim 20, wherein the higher resistivity of the second material of the cap acts to concentrate the heating in the cap.

24. The method of claim 23, wherein concentrating the heating in the cap concentrates the heating near an interface between the cap and the programmable volume of the phase change cell material.

25. The method of claim 20, wherein an upper surface of the cap contacts the phase change cell material.

* * * * *